United States Patent
Parsons

[19]

[11] Patent Number: 5,929,523
[45] Date of Patent: Jul. 27, 1999

[54] OS RECTIFYING SCHOTTKY AND OHMIC JUNCTION AND W/WC/TIC OHMIC CONTACTS ON SIC

[75] Inventor: James D. Parsons, Beaverton, Oreg.

[73] Assignee: 3C Semiconductor Corporation, Portland, Oreg.

[21] Appl. No.: 08/612,216

[22] Filed: Mar. 7, 1996

[51] Int. Cl.[6] .......................... H01L 23/48; H01L 23/52; H01L 29/40
[52] U.S. Cl. .............................. 257/750; 257/77
[58] Field of Search .................... 257/77, 78, 81, 257/750; 438/931, 575, 580, 523, 597, 571

[56] References Cited

U.S. PATENT DOCUMENTS

| | | | |
|---|---|---|---|
| 3,047,439 | 7/1962 | Daal et al. | 257/77 |
| 3,611,064 | 10/1971 | Hall et al. | 257/81 |
| 3,844,029 | 10/1974 | Dibugnara | 257/750 |
| 4,663,649 | 5/1987 | Suzuki et al. | 357/67 |
| 4,764,435 | 8/1988 | Hosizaki et al. | 428/621 |
| 5,124,779 | 6/1992 | Furukawa et al. | 257/77 |
| 5,165,283 | 11/1992 | Kurtz et al. | |
| 5,388,027 | 2/1995 | Pollock et al. | 257/711 |
| 5,436,505 | 7/1995 | Hayashi et al. | 257/763 |
| 5,635,412 | 6/1997 | Baliga et al. | 438/523 |
| 5,668,382 | 9/1997 | Toda et al. | 257/77 |

FOREIGN PATENT DOCUMENTS

| | | | |
|---|---|---|---|
| 4-317374 | 11/1992 | Japan | 257/77 |
| 5-283361 | 10/1993 | Japan | 257/77 |
| WO 97/33308 | 9/1997 | WIPO . | |

OTHER PUBLICATIONS

Daimon, H.; Yamanaka, M.; Sakuma, E.; Misawa, S. and Yoshida, S., "Annealing Effects on Al and Al–Si Contacts to 3C–SiC," Japan Jour. Appl. Phys., vol. 25, No. 7 (1986) L592.

Crofton, J.; Barnes, P.A. and Williams, J.R., "Contact resistance measurements on p–type 6H–SiC," Appl. Phys. Lett., vol. 62, No. 4 (1993) 384.

Chen, J.S.; Kolawa, E., Nicolet, M.A.; Ruiz, R.P., Baud, L.; Jaussaud, C. and Madar, R., "Solid–state reaction of Pt thin film with single crystal (001)β–SiC," J. Mater. Res., vol. 9, No. 3 (1994) 648.

(List continued on next page.)

*Primary Examiner*—Olik Chaudhuri
*Assistant Examiner*—Phat X. Cao
*Attorney, Agent, or Firm*—Marger Johnson & McCollom, P.C.

[57] ABSTRACT

Metallic osmium on SiC (either β or α)forms a contact that remains firmly attached to the SiC surface and forms an effective barrier against diffusion from the conductive metal. On n-type SiC, Os forms an abrupt Schottky rectifying junction having essentially unchanged operating characteristics to at least 1050° C. and Schottky diodes that remain operable to 1175° C. and a barrier height over 1.5 ev. On p-type SiC, Os forms an ohmic contact with specific contact resistance of <$10^{-4}$ ohm-cm$^2$. Ohmic and rectifying contacts to a TiC layer on a SiC substrate are formed by depositing a WC layer over the TiC layer, followed by a metallic W layer. Such contacts are stable to at least 1150° C. Electrodes connect to the contacts either directly or via a protective bonding layer such as Pt or PtAu alloy.

54 Claims, 8 Drawing Sheets

OTHER PUBLICATIONS

Paparicolaou, N.A.; Christou, A. and Gipe, M.L., "Pt and PtSi$_x$ Schottky contacts on n–type β–SiC," J.Appl. Phys., vol. 65, No. 9 (1988) 3526.

Padovani, F.A. and Stratton, R., "Field and Thermionic–Field Emission in Schottky Barriers," Solid St. Elect., vol. 9 (1966) 695.

Parsons, J.D.; Kruaval, G.B. and Chaddha, A.K., "Low specific resistance (<6×10$^{-6}$Ω•cm$^2$) TiC ohmic contacts to n–type β–SiC," A.P.L., vol. 65, No. 16 (1994) 2075.

Chaddha, A.K.; Parsons, J.D. and Kruaval, G.B., "Thermally Stable, Low Specific Rsistance (1.30×10$^{-5}$Ω•cm$^2$) TiC Ohmic Contacts to n–type 6Hα–SiC," A.P.L., vol. 66, No. 6 (1995).

GE Corporate Research & Development letter dated Jan. 1, 1996, to Director BDMO, DoD.

Glass, R.; Palmour, J.W.; Porter, L. and Baumgarner, J., "Platinum Contacts to p–type 6H–SiC" Research report of Cree Research & N.C. State University presented at ARPA––sponsored "Workshop on High Power Electronics" Washington D.D. (Sep. 1995).

Kimoto, T., et. al., IEEE Elect. Dev. Let., V. 14, No. 12 (1993) 548.

Zhao, Q. H., Parsons, J.D., et al. "Single Crystal Titanium Carbide, Epitaxially Grown on Zincblend and Wurtzite Structures of Silicon Carbide" Materials Research Bulletin, vol. 30, No. 6, pp. 761–769 (1995).

Baliga, B. Jayant, Modern Power Devices, pp. 344–405 (1987).

Porter, Lisa M. and Davis, Robert F., "A critical review of ohmic and rectifying contacts for silicon carbide," Materials Science and Engineering B 34 (1995) 83–105.

Nennewitz, O.; Spiess, L.; Breternitz, V., "Ohmic contacts to p–type 6H–silicon carbide," Applied Surface Science 91 (1995) 347–351, Elsevier Science Ltd..

Lundberg, N. and Östling, "Thermally Stable Low Ohmic Contacts to p–Type 6H–SiC Using Cobalt Silicides," Solid–State Electronics vol. 39, No. 11, pp. 1559–1565, 1996, Elsevier Science Ltd.

Sachse, Herbert B., "Semiconducting Temperature Sensors and their Applications," pp. 124–129; 322–323; 344–345; 1975, John Wiley & Sons, Inc., New York.

OS RECTIFYING SCHOTTKY AND OHMIC JUNCTION AND W/WC/TIC OHMIC CONTACTS ON SIC

This invention was made with the U.S. Government support under Grant Numbers DASG60-95-C-0066 and DASG60-96-C-0157 awarded by the Ballistic Missile Defense Organization. The U.S. Government has certain rights in the invention.

BACKGROUND OF THE INVENTION

This invention relates generally to electrical contacts on SiC-based semiconductor devices. and more particularly to ohmic and rectifying contacts on silicon carbide semiconductors.

SiC possesses tremendous advantages for high temperature and high power solid state electronics. In addition, it offers potential advantages for high frequency and logic circuit applications: e.g., power conversion (mixer diodes, MESFETs), single chip computers (n-MOS, CMOS, bipolar transistors), non-volatile random access memory SiC CCDs can hold charge for more than a thousand years thus, for example, making hard disks a thing of the past.

The potential maximum average power, maximum operating temperature, thermal stability, and the reliability of SiC electronics far exceeds Si or GaAs based electronics. The degree to which these advantages of SiC can be utilized, however, is presently constrained by the thermal stability and electrical properties of the metal/SiC junctions. The primary reasons for this are: (1) the power density of SiC devices is limited by the thermal stability of the ohmic contact junctions, and (2) substantial cooling is required to insure the stability of electrical contact junctions.

For a long time, researchers have been striving without success to develop electrical contacts to silicon carbide trying overcome these constraints. Until these constraints are removed, SiC devices/circuits offer only marginal—if any—advantages over Si and GaAs. Utilization of the full performance potential of SiC itself (for all devices), requires four types of performance-limiting electrical contacts: (1) ohmic to p-type SiC, (2) ohmic to n-type SiC, (3) rectifying to p-type SiC, and (4) rectifying to n-type SiC.

The value of SiC electronics lies in its potential to extend the capabilities of solid state electronics beyond what is possible with Si or GaAs. Thus, suitable electrical contact characteristics obtained in the laboratory—under low stress conditions—must not drift or degrade, due to changes at the metal/SiC junctions, under actual device operating conditions. This requires two additional attributes of metal/SiC electrical contacts. First, the contact metal must form a junction with SiC that is chemically stable to approximately 1000° C. (joule heating at high forward current densities in power SiC devices could easily cause metal/SiC junctions to reach such temperatures). Second, the contact metal (or metallization structure) must act as a diffusion barrier to circuit and bonding metals (electrode metals) at the same temperatures. Metal/SiC electrical contacts demonstrated previously do not come close to meeting all these stability requirements.

The best known p-type SiC ohmic contact metallizations demonstrated to date are Al, Al/Ti and Pt (Refs. 2,3). Although specific contact resistances as low as $1 \times 10^{-5} \Omega \cdot cm^2$ have been reported in laboratory studies, actual SiC devices exhibit p-type contact resistances of $1 \times 10^{-2} \Omega \cdot cm^2$ to $1 \times 10^{-3} \Omega \, cm^2$ (Refs 10, 11).

Aluminum and its silicides, and Al/Ti form thermally unstable interfaces with SiC and/or have melting problems (Ref. 12, pg. 2). Platinum reacts with SiC to form many different silicides at temperatures as low as 280° C. At temperatures as low as 400° C., Pt continues to react with SiC until it is entirely consumed by the formation of PtSi (Refs. 4, 5). Thus, Pt cannot protect its contact from circuit and bonding metal diffusion; this characteristic of Pt, in contact with SiC, requires that Pt itself not be used as a circuit or bonding metal. Further, PtSi reacts with virtually all suitable circuit and bonding metallizations at very low temperatures.

Virtually every electronic device—unipolar or bipolar—requires n-type ohmic contacts. The most successful n-type SiC ohmic contact metallizations demonstrated to date are Ni and TiC. Both exhibit specific contact resistances between $1 \times 10^{-5} \Omega \cdot cm^2$ and $1 \times 10^{-6} \Omega \cdot cm^2$ (Ni: Ref. 13; TiC: Refs. 7&9). Nickel forms silicides at very low temperatures. Its graded Ni-silicide junction is thermally unstable, and it cannot form a protective diffusion barrier to circuit and Other Ohmic contacts formed of silicide, nitride, carbide or multiple layers of such materials exhibit stability problems similar to Ni contacts. Transition metals SiC surfaces, and they spall at elevated temperatures.

TiC forms an electrical ohmic contact junction with n-type SiC, that is stable to at least 1400° C. (Ref. 14). However, it reacts with all candidate circuit and bonding metals at low temperatures; thus, it cannot form a protective diffusion barrier to circuit and bonding metals.

Low work function metals and semi-metals, that do not react with SiC to form tunnel junctions, can be used to form rectifying electrical contacts to p-type SiC. This type of electrical contact has not been required for SiC devices demonstrated to date; thus, there is little, if any, background literature. We have demonstrated that TiC forms an excellent rectifying contact to p-type SiC, that is stable to at least 1400° C. (Ref 14.). However, it reacts with all candidate circuit and bonding metals at low temperatures; thus, it cannot form a protective diffusion barrier to circuit and bonding metals.

The n-type, rectifying Schottky diode is required to modulate the current and voltage in all majority carrier solid state devices. The most important devices of this type are Schottky diodes and MESFETs. Excellent adhesion and abrupt metal-SiC interfaces are cornerstone requirements for this type of contact. Metallizations previously developed for this purpose exhibit various deficiencies. For example, attempts to make thermally stable Schottky rectifying junctions on n-type SiC have been stymied. Many of the metals that are capable of forming such junctions (e.g., Ti, Au/Ti, Pt and PtSi) react with SiC to form silicides at relatively low temperatures, or—in the case of Au—do not adhere to the SiC surface. The electrical contact junction is thermally unstable, leading to compositional grading of the junction interface at elevated temperatures. This grading effect is exacerbated by the creation of free carbon at the original metal/SiC interface, causing substantial performance degradation, and limiting SiC device operation to well below the capabilities of SiC itself. The (W/Ti, Ti, Au/Ti and Pt)/SiC n-type Schottky junctions demonstrated by Cree Research, N.C. State, NASA Lewis and the Japanese, are unstable at high temperatures or under sustained high current density conditions.

The best rectifying contact metal to n-type SiC, demonstrated to date appears to be W/Ti, extensively tested at the U.S. Army Res. Labs in Adelphi, Md. This contact, however, exhibited unstable leakage-current characteristics, probably due to thermally-driven reactions at the interface. The testing consisted of cycling the junctions between room temperature and 500° C. (number of cycles unknown), and measuring the junction reverse leakage current I(L) at room temperature as a function of the number of cycles. During a first series of cycles, I(L) increased. During the next series of cycles, I(L) decreased, reaching a minimum value about 10 $\mu$A greater than it was before stress testing was begun. Thereafter, I(L) did not change.

U.S. Pat. No. 2,918,396 to Hall describes formation of rectifying and ohmic contacts on silicon carbide PN diodes and PNP and NPN transistors by alloying two silicon-acceptor or silicon-donor alloy globules to an N-type or P-type silicon carbide crystal at high temperature, (1700° C.). The alloying metals disclosed include aluminum, phosphorus, tungsten, molybdenum or tungsten-molybdenum, with nickel or tungsten conducting electrodes.

U.S. Pat. No. 3,308,356 to Rutz discloses a method of making rectifying contacts to PN junctions in a silicon carbide substrate bonded on one side to a tungsten block by alloying fragments of silicon doped with Ga (P-type) or As (N-type) onto the exposed face of the SiC substrate in a forming gas atmosphere (90% N, 10% H) at high temperature.

U.S. Pat. No. 3,510,733 to Addamiano discloses forming on SiC semiconductor devices electrical leads of an alloy consisting primarily of chromium and nickel, but which can include traces of Si, C and Fe.

U.S. Pat. No. 4,738,937 to Parsons describes a method of making nonrectifying (ohmic) Schottky contacts on a semiconductor substrate, such as Si or SiC, by epitaxially depositing a metal having suitable work function and lattice parameters, the identified metals including Yb on Si, $NiSi_2$ and W on N-type Si, and TiC on N-type $\beta$SiC.

U.S. Pat. No. 5,442,200 to Tischler discloses forming an ohmic contact on a SiC surface by depositing a sacrificial silicon layer followed by a metal (Ni, Cr, Pd, Ti, W, Ta, Mb, Co, Zr or mixtures or alloys thereof to form a noncarbonaceous ohmic contact structure.

U.S. Pat. No. 5,448,081 to Malhi proposes a MOSFET device formed on a SiC substrate, with doped source and drain regions but does not disclose any means for connecting electrodes to such regions.

U.S. Pat. No. 5,471,072 to Papanicolaou discloses a Pt rectifying contact and a Ti/Au ohmic contact on n-type SiC. Both forms of contacts degrade at high operating temperatures, e.g., subject to catastrophic degradation at over 800° C. as disclosed and probably unstable at temperatures of 500° C. or less.

Although the semiconductor materials $\alpha$ and $\beta$-SiC have a demonstrated capability for stable, efficient performance at high temperatures, the same is not true of SiC devices/circuits, due to the instabilities of their electrical contact structures.

Also, applicant has learned that a TiC contact on SSiC does not, by itself, form a diffusion barrier to circuit or bonding metals. Appropriate circuit/bonding metals such as W, Pt, Au and Pd, form intermetallics with TiC. These solid state reactions change the composition of the electrical contact junction, thus degrading it.

Accordingly, a need remains for thermally stable ohmic and rectifying electrical contacts to n-type and p-type SiC.

SUMMARY OF THE INVENTION

It is, therefore, one object of the invention to make an electrical contact to SiC; where, the contact metal exhibits the following properties:

1. Metal/SiC junction stable to over 1000° C.,
2. Protects its junction with SiC from circuit and bonding metal diffusion (forms an electrically transparent diffusion barrier) to >1000° C., and either
3. Forms an ohmic electrical contact to p-type SiC, or
4. Forms rectifying (Schottky) contact to n-type SiC.

Another object of the invention is to form an electrically transparent diffusion barrier (ETDB) for TiC electrical contacts to SiC; where, the ETDB exhibits the following properties:

1. ETDB/TiC junction is stable to over 1000° C.,
2. Protects its junction with TiC from circuit and bonding metal diffusion to 1000° C.; thereby, also protecting the TiC/SiC junction.

In one aspect of the invention, I have discovered that osmium (Os) forms a rectifying (Schottky) metal junction on n-type SiC semiconductor surfaces, which remains abrupt and firmly attached to at least 1050° C. A thermally stable contact structure is made by forming a metallic osmium layer on the surface of a semiconductive SiC substrate (either $\beta$ or $\alpha$) and connecting a conductive metal electrode to the osmium layer through a suitable metal bonding and protective layer, such as Pt or PtAu alloy. The room temperature rectifying characteristics of this structure on n-type SiC are essentially unchanged by annealing at temperatures as high as 1050° C. for 2 hours in an inert environment (Ar, hydrogen or vacuum). These junction degrade, but remain operable after annealing for 1 hour at temperatures as high as 1175° C. The resulting barrier height of Os/n-type SiC junctions is 1.78±0.1 ev. Of equal importance, the Os layer forms a diffusion barrier, which prevents diffusion of electrode metals to the Os/(n-type SiC) junction.

On P-type SiC, the Os layer will form an ohmic contact with the lowest specific contact resistance of now possible with ohmic contacts to p-type SiC. Stable, low resistance, p-type ohmic contacts are the key to development of all SiC bipolar high temperature power electronics. Forming an Os contact on p-type SiC will provide a lower-energy tunneling barrier and thinner tunnel depth than Pt contacts on p-type SiC.

Os can also be deposited on $SiO_2$ to form MOS gate structures and field spreading structures. Os on $SiO_2$ forms a stable interface and has mechanical and thermal properties equal to those of Os on SiC.

Another aspect of the invention, is a method and structure for making an electrically transparent diffusion barrier (ETDB) which shields TiC/SiC junctions from electrode metals to 1150° C., and which forms a metallurgical junction with TiC that remains firmly attached and is stable to 1150° C. The ETDB structure consists of 2 layers: (1) a tungsten carbide (WC) layer in contact with the TiC surface, and (2) a layer of elemental tungsten (W) on the WC surface. This ETDB structure works because W is stable in contact with WC at a temperature greater than 1150° C. The TiC/SiC junction remains stable because W does not react with WC to form $W_2C$ in this temperature range (unlike all other transition metals in contact with their mono-carbides). Thus, a concentration gradient to drive diffusion between the WC/TiC, and thus, TiC/SiC interfaces does not exist. 1.78 Elemental W is the actual diffusion barrier. It forms a bond with potential electrode metals because of solid solubility which increases with increasing temperature. Once "formed", the thin bonding layer is absolutely stable at or below the forming temperature. Electrodes can then be freely connected to this contact layer either directly or though a suitable intermediate bonding layer such as Pt or PtAu alloy. Such contacts are stable to at least 1050° C.

The invention enables fabrication of SiC devices and circuits that will not degrade, or become unstable, under all strain conditions (thermal, electric field, mechanical) for which SiC itself can perform as a semiconductor device. This invention removes all restrictions imposed by metal contacts on the operating envelope of SiC solid state device technology. In particular, it provides rectifying (Schottky) junctions and ohmic contacts that will withstand sustained exposure to temperature as high as 1150° C., and electron migration effects at high electric fields.

Os forms a rectifying Schottky junction to n-type SiC, as do several other metals. Os is set apart from all other metals by the following characteristics: (1) it forms an electrically transparent diffusion barrier to 1050° C. {which protects the junction from diffusion of electrode metals}, (2) the Os/SiC junction itself remains stable to 1050° C., and (3) the electrical properties of the junction do not change after sustained exposure to temperatures as high as 1050° C. Os will form an ohmic contact junction to p-type SiC exhibiting the same unique stability characteristics as the n-type SiC rectifying junction.

W/WC is an electrically transparent diffusion barrier, which forms a stable junction with TiC to 1150° C. Its purpose is to protect the chemical and electrical integrity of the TiC/SiC junction. TiC forms ohmic contact junctions to n-type SiC; and rectifying contact junctions to p-type SiC. The TiC/SiC junction, by itself, is stable to temperatures greater than 1400° C.

Based on the foregoing developments, applicant has developed a family of high temperature/power semiconductor devices which satisfy a number of unmet commercial needs. One immediate application is thermal sensors. The invention can be used to make junction or resistive thermistors, that measure temperatures to 1922° F. (>1050° C.), and 2100° F. (1150° C.). This development permits SiC thermistors to compete, for the first time, with thermocouples, oxide resistors and pyrometers in the temperature range of 300° F. to 2100° F. (150° C. to 1150° C.). It also enables the manufacture of hostile environment transducers, operable at temperatures above 460° F. (238° C.).

The invention enables making Schottky diodes, PN diodes and transistors as either discrete devices or as components of integrated circuits. Importantly, the invention opens up many potential applications in the power conditioning and conversion field, such as power rectifiers for converting AC power to clean DC power. N-SiC Schottky rectifiers could handle powers nearly as high as the best Si PN junction rectifiers, and PN junction SiC rectifiers could replace vacuum tubes. Other types of devices include bipolar transistors, thyristors, MOSFETs, MESFETs, IGBTs, and mixer diodes for use in communications, as well as digital and analog to digital electronics.

In summary, all solid state semiconductor devices require one, or more, of the four electrical contacts discussed, which the present invention makes possible.

The foregoing and other objects, features and advantages of the invention will become more readily apparent from the following detailed description of a preferred embodiment of the invention which proceeds with reference to the accompanying drawings.

DETAILED DESCRIPTION

Figure 1:
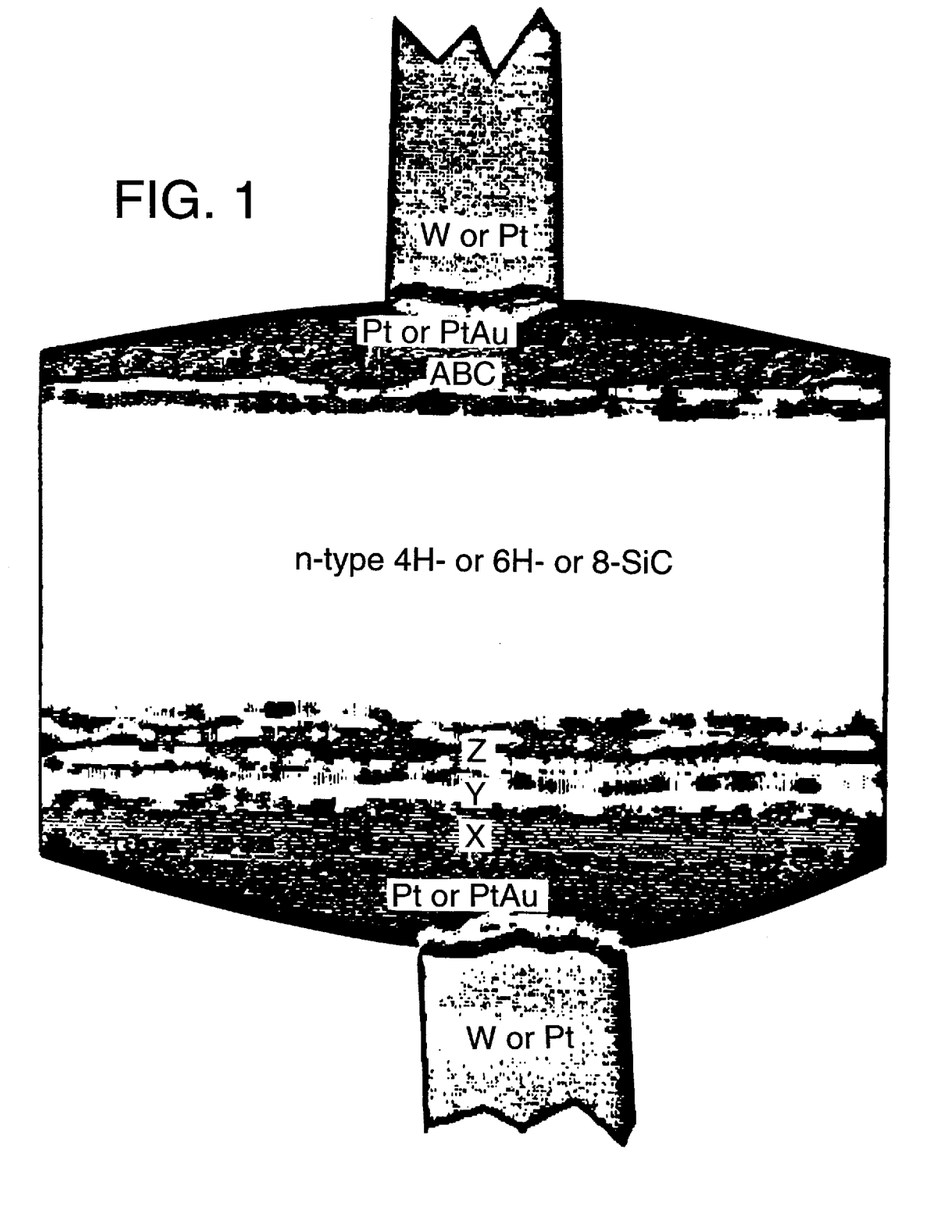
FIG. 1 is a cross-sectional diagram of a vertical n-type SiC Schottky diode structure made using prior electrical contacts, showing blurring (interdiffusion) of junctions that results from operation at temperatures greater than 300° C.
Figure 2:
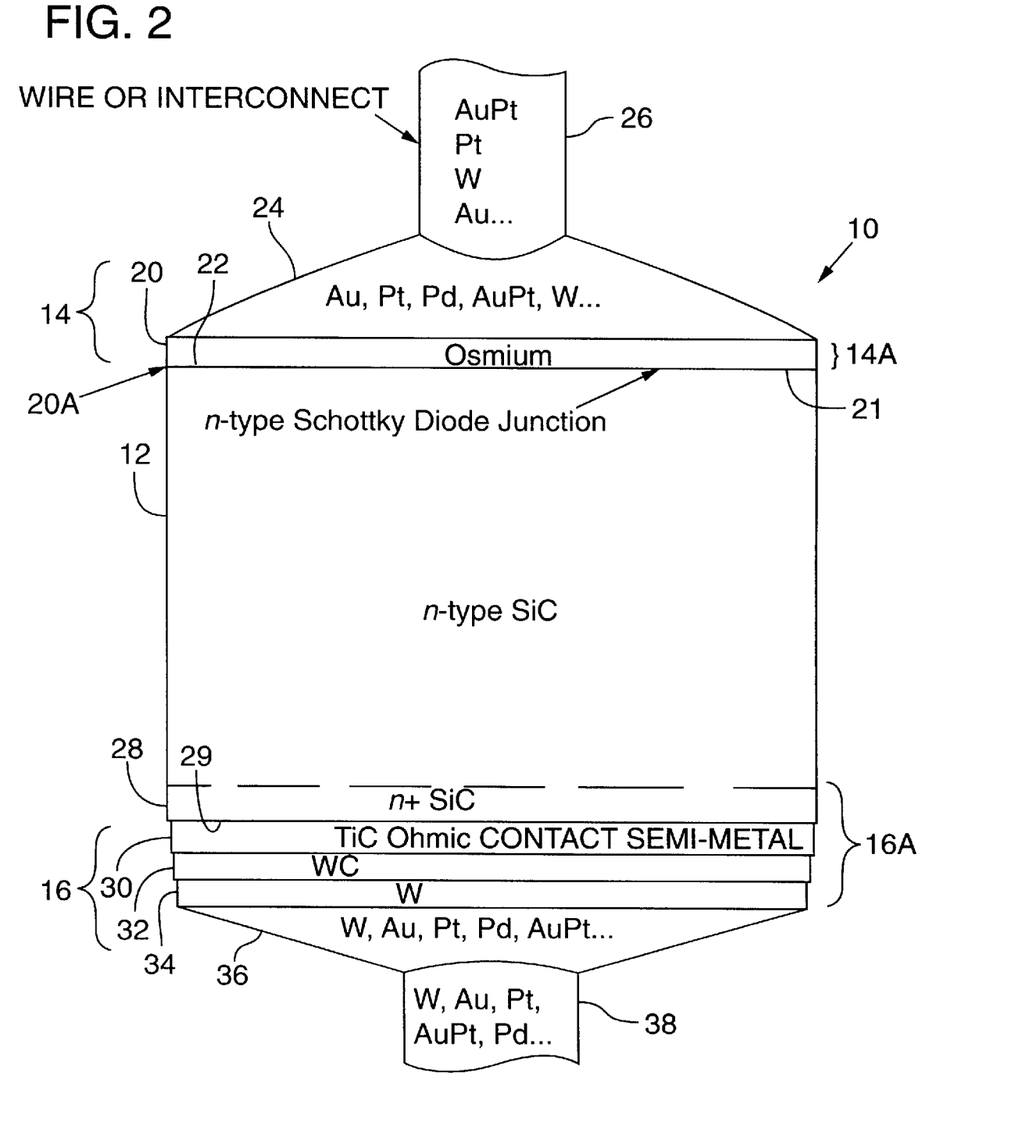
FIG. 2 is a cross-sectional diagram of a vertical n-type SiC Schottky diode structure made according to the present invention., as fabricated, and after sustained operation at temperatures up to 1050° C.

Applicant herein has experimented extensively trying to make operative devices. FIG. 1 and FIG. 2 are cross-sectional views of two versions of MESFET structures formed on a SiC substrate. The device of FIG. 2 has an Os/Si gate contact and W/WC/TiC source and drain contacts in accordance with the invention. The device of FIG. 1 is based on the TiC/SiC metallic/semiconductor combination described in his prior U.S. Pat. No. 4,738,937. FIG. 1 illustrates the problems encountered in trying to make contacts to both the upper SiC surface and the lower TiC surface of the structure. Even if the metal layers applied to such surfaces form clean, abrupt interfaces in their as-deposited state, the boundaries of these interfaces blur when the devices are annealed due to diffusion into and/or reactions with: (1) the silicon carbide (top rectifying junction, and (2) the TiC ohmic contact.

Schottky Diode with Os Schottky and TiC/WC/W Ohmic Contacts

Referring to FIG. 2, the present invention is described with reference to the fabrication of a vertical Schottky diode 10 formed on a silicon carbide (SiC) substrate 12, with a Schottky rectifying junction and contact structure 14 formed on an upper side thereof, and an ohmic contact structure 16 formed on an opposite or lower side thereof. The starting material is a single-crystal wafer of uniformly-doped, N-type SiC, designated as substrate 12. First, the n+-SiC/TiC/WC/W structure 16A is formed (in which TiC=ohmic contact semi-metal; WC/W=ETDB); then, the Schottky rectifying junction and ETDB structure 14A is formed, by the processes described in further detail below together with examples of suitable dimensions of the various layers that form the contact structures. Subsequently, wires may be bonded to the structure to complete contact structures 14 and 16 as shown, or circuit metals may be deposited on and reacted with the ETDB surfaces to complete the structure. In either case, the resulting contacts will be thermally stable to 1050° C. (contact structure 14) and 1150° C. (contact structure 16).

The Schottky rectifying junction and ETDB structure 14A preferably comprises a very thin layer 20A of Si ($\leq 1$ monolayer). The purpose of this layer is to permit Os to bond to the SiC surface 22 without creating a monolayer of free carbon. A layer 20 of osmium then deposited on and in contact with the upper surface 22 of substrate 12. The interface of the osmium layer with substrate 12 forms a Schottky rectifying junction 21, once the structure is annealed ("formed") at a temperature approximately equal to or greater than or 900° C. Preferably, layer 20 consists of elemental osmium (Os), but some impurities can be included, due to mixing of osmium and bonding/circuit metals at the exposed Os surface due to solid solubility, and a few monolayers of OsSi will form between the Os and the SiC when structure 14 is completed.

A metal protective cap and bonding layer 24 is formed on and in contact with the osmium layer 20. A first circuit metallization or wire 26 is electrically and mechanically connected to the upper side of the device 10 via the bonding layer 24. The bonding layer 24 preferably comprises a layer of platinum (Pt), gold (Au) or gold-platinum (AuPt) alloy, although other known electrical contact metals can be used, in particular tungsten or tungsten-platinum, but any metal selected from a group consisting of Pt, Pd, W, Ti, Hf, Zr, Au, PtAu, V, Cr, Fe, Ni, Cu, Nb, Mo, Tc, Ru, Rh, Ag, Ta, Re, Ir, can be used. The circuit metallization or wire 26 is preferably tungsten (W), although an alloy of tungsten can also be used, as well as other metals compatible with the bonding metals and intended operating temperatures and environments. The use of Os removes all restrictions on the bonding/circuit metal type, method of application and the bond "forming" temperature.

The ohmic contact structure 16 on the underside of the substrate 12 includes a tungsten carbide (WC) layer 32 deposited on the TiC layer 30. Preferably, the structure of the Schottky diode 10 includes an n+doped SiC layer 28 on the underside of the n-type substrate, with the TiC layer 30 contacting the lower surface 29 of layer 28 to form an ohmic contact. Tungsten carbide layer 32 covers the TiC layer 30 and a layer 34 elemental tungsten(W) is in turn deposited on the WC layer 32. A bonding layer 36 on the tungsten layer 34 connects a second circuit metallization or wire 38 to the device. The bonding layer 36 is preferably of Pt or PtAu, but could alternatively by made of W, Pd, Au, or any other compatible electrical contact metals. The wire 38 is preferably tungsten but could alternatively be Pt, PtAu, Au, Pd or other compatible metals.

This structure forms a highly stable Schottky diode which remains stable under high temperature conditions, over 1050° C. without discernible changes in I-V characteristics, and operative as a Schottky diode after annealing at temperatures up to about 1175° C.

Using elemental osmium to form the Schottky junction and ETDB structure 14A on N-type SiC ($n \leq 1 \times 10^{18} cm^{-3}$) produces the highest known barrier height: 1.78±0.1 electron volts, as compared to a range of 1.1 to 1.2 ev. for prior Schottky junctions in SiC. The Os/n-SiC junctions will block substantially higher voltages than possible with any other known metal.

Figure 9A:
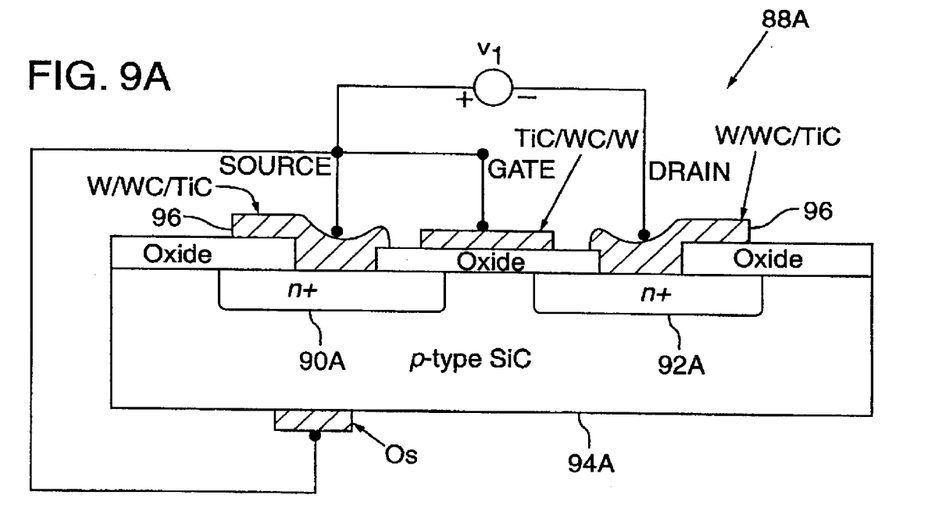
FIGS. 9A and 9B are cross-sectional views of N-channel and P-channel MOSFETs formed on a semiconducting SiC substrate with an Os/oxide gate structure and respective W/WC/TiC or Os ohmic source and drain contacts, in accordance with the invention.
Figure 9B:
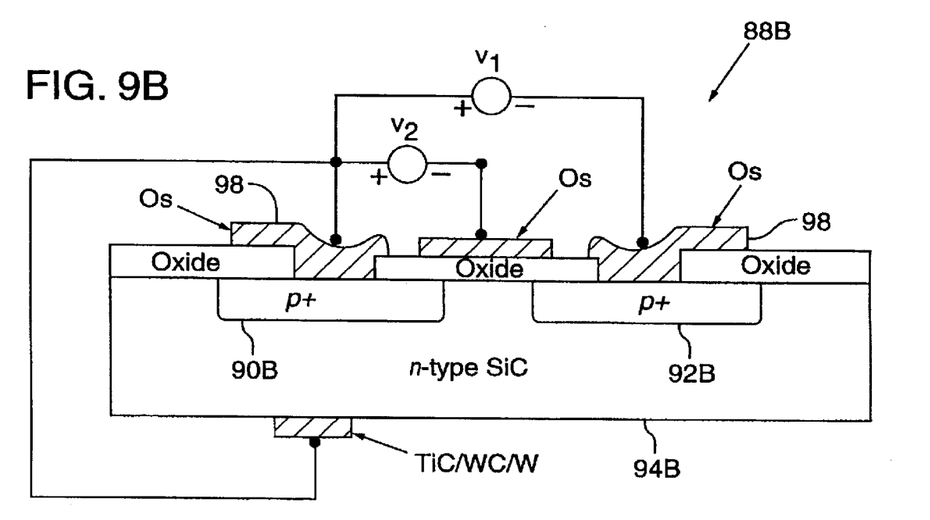

The physical properties of the Os/SiC interface are also advantageous, with good interface adhesion and expansion coefficient mismatch characteristics that will readily exceed device/circuit requirements, and so does not spall. The osmium film remains smooth after annealing, and does not scratch or peel. The osmium layer additionally provides a diffusion barrier to circuit metallizations that is effective to temperatures of at least 1050° C. Os will form an interface with SiC and a diffusion barrier that is stable over a broader range of thermal, electrical and mechanical stresses than any other known metals. Also, Os does not react with $SiO_2$, when annealed in $H_2$ in the absence of oxygen at up to 1050° C. Thus, the use of osmium is compatible with MOS fabrication processes and can readily be used as a gate metal over oxide, as shown in FIGS. 9A and 9B.

The ohmic contact structure 16 with WC layer 32 covering the TiC layer 30 and layer 34 of elemental tungsten (W) on the WC layer 32 forms a highly advantageous ohmic contact on the SiC substrate. It forms an electrically transparent interface to the substrate onto which it is practical to deposit all known electrical contact metals. It provides a very hard surface as well as an effective diffusion barrier to circuit metallizations to at least 1150° C. It forms a stable interface that does not diffuse into the TiC layer or the SiC substrate, unlike other metals applicant has tried (e. g., Au, Ag, Ti). The W/WC layers form a diffusion barrier which is stable over a broader range of thermal, electrical and mechanical stresses than any other known metals. The WC layer 32 in contact with the TiC layer 30 stabilizes the TiC/SiC junction to about 1150° C. The W layer 34 on the WC layer stabilizes the WC/TiC junction to about 1150° C.

PN Diode with Osmium Ohmic Contact

Figure 3:
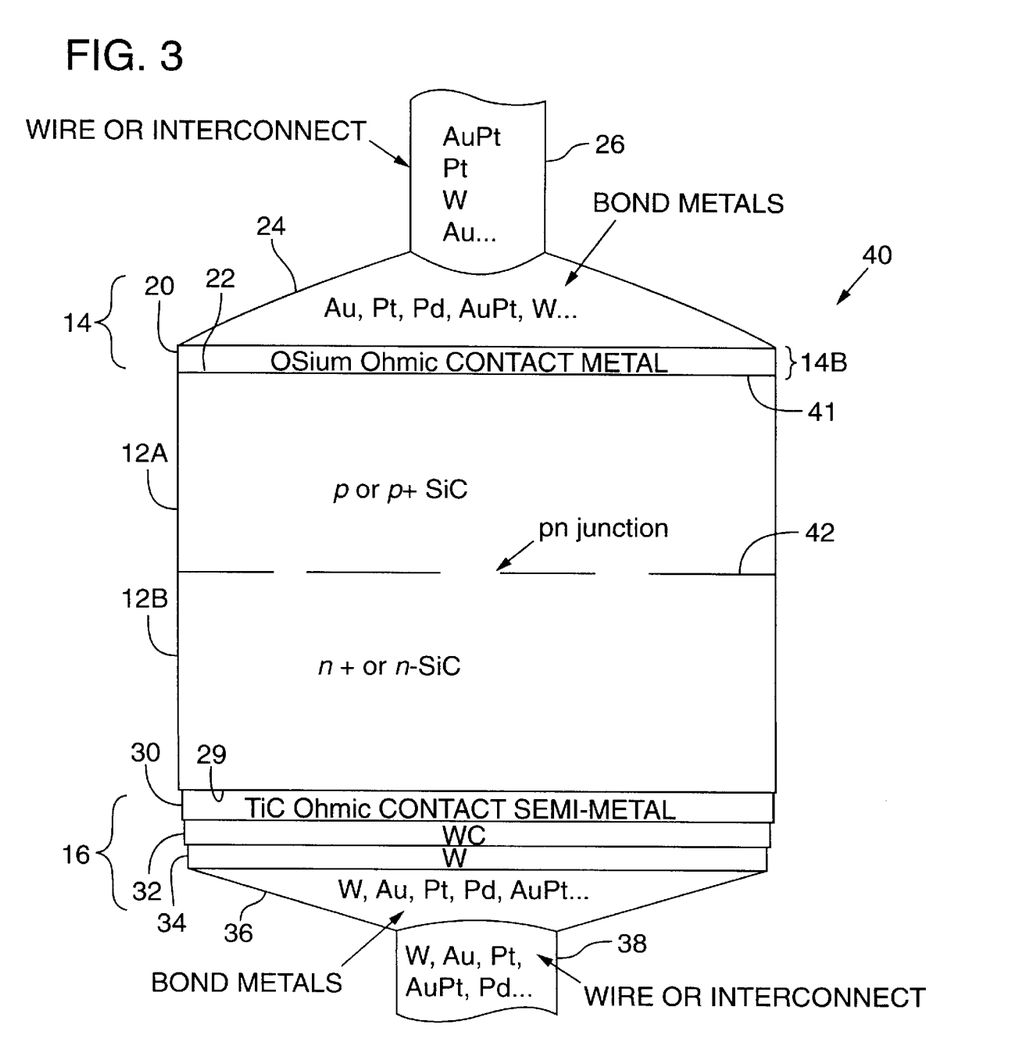
FIG. 3 is a cross-sectional diagram of a vertical SiC PN diode structure made according to the present invention.

Referring next to FIG. 3, the invention can also be used to form contacts on semiconductor devices comprising multiple layers of opposite dopant types, such as a vertical pn diode 40. Much of the structure shown in FIG. 3 is similar to that of FIG. 3, so similar reference numerals are used wherever applicable to identify like features already described above. The main difference is that the substrate is doped to form two dopant-type regions or layers, a p-type layer 12A and a n-type layer 12B, interfacing at a pn junction 42. The p-type layer is formed in the upper portion of the substrate to form a nonrectifying ohmic junction 41 at upper surface 22, instead of the Schottky junction described above, and can include a p+ region adjacent surface 22. Another difference between this ohmic contact and ETDB structure 14B and the Os/n-SiC rectifying Schottky contact and ETDB structure 14A, is that the Si layer is not required in structure 14B. This is because a few monolayers of free carbon at the Os/SiC junction will not have any detrimental effects on the ohmic contact performance.

The ohmic junction 41 between the osmium layer 20 and the p-type SiC material 12A should exhibit a specific contact resistance of $10^{-4}$ ohm-$cm^2$ or less. The diffusion and mechanical properties of Os/SiC ohmic contacts are identical to those of the above-described Schottky contacts.

Description of Schottky Diode Fabrication Process

Figure 4A:
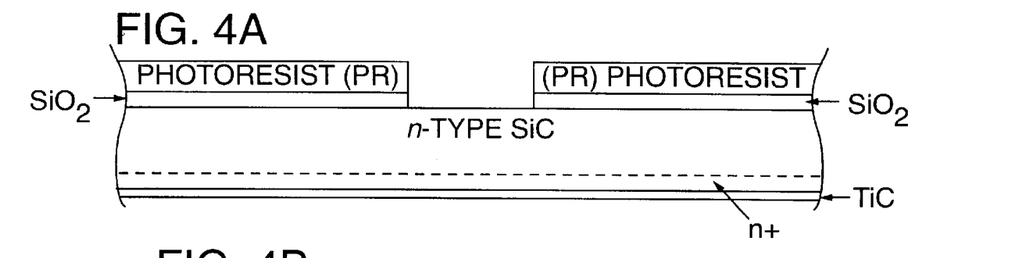
FIGS. 4A, 4B, 4C, 4D and 4E are cross-sectional views showing the photolithography, Si deposition and osmium deposition and annealing to form a vertical n-type SiC Schottky diode (with electric field spreading $SiO_2$ ring) on the upper surface of the an n-type SiC substrate, in an Os/SiC n-Schottky diode fabrication process according to the invention.
Figure 4B:
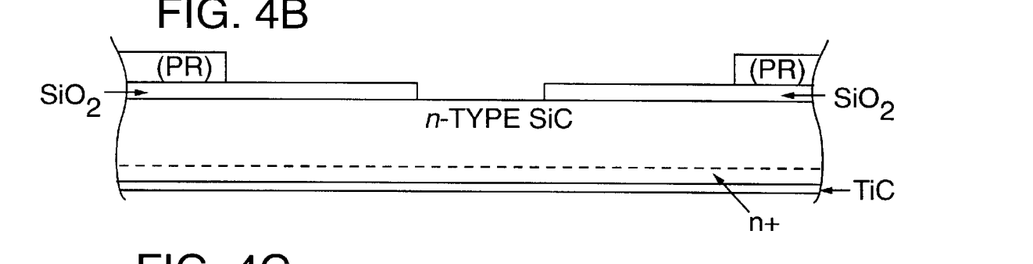
Figure 4C:
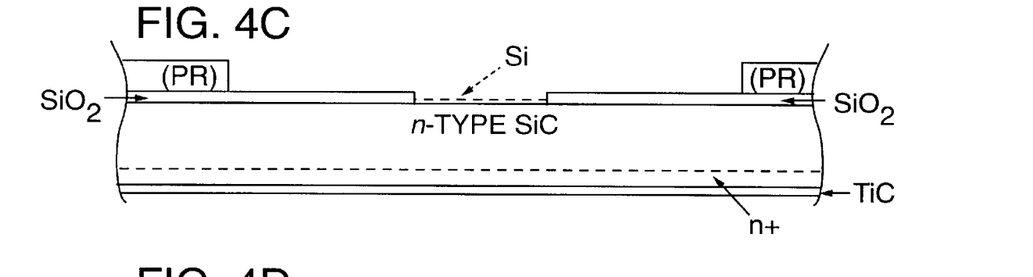
Figure 4D:
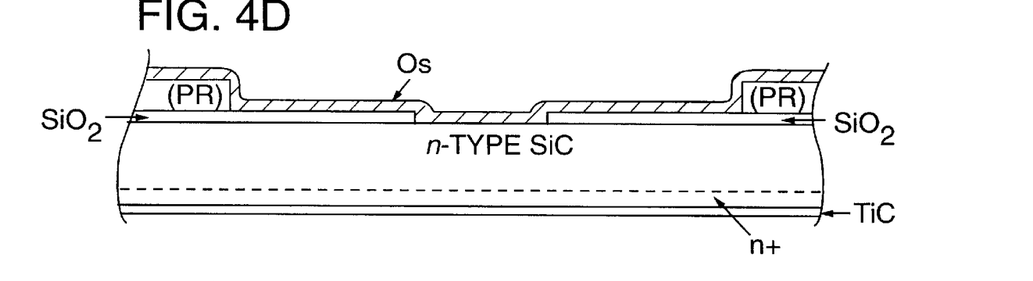
Figure 4E:
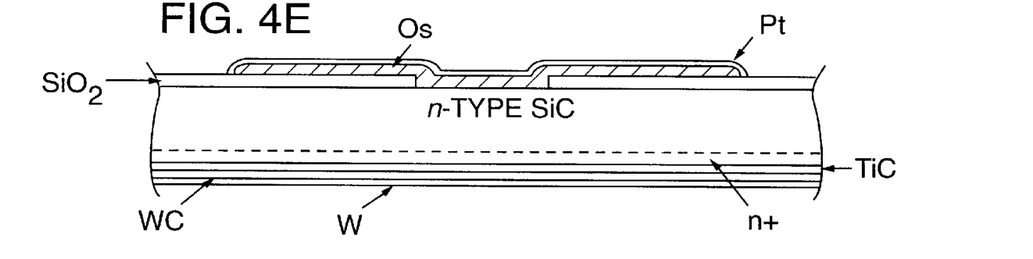
Figure 5:
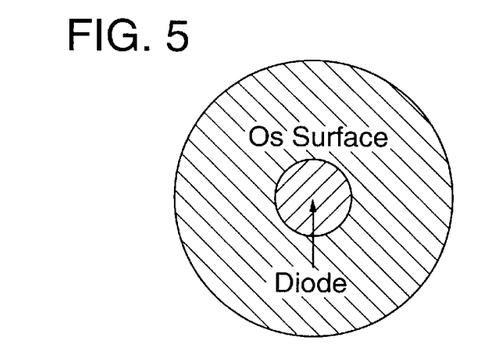
FIG. 5 is a top plan view of the diode structure formed by the fabrication process of FIGS. 4A, 4B, 4C, 4D and 4E; and an edge view of the diode structure.
Figure 6:
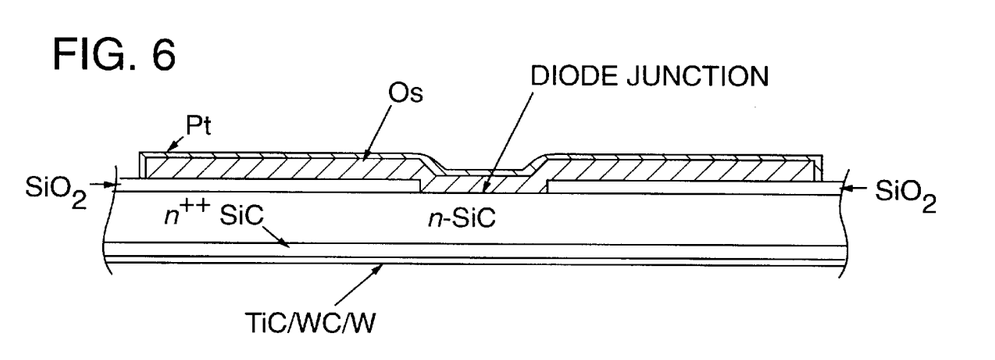
FIG. 6 is a cross-sectional view of the diode of FIG. 5 after applying a platinum layer over the osmium layer.

Following is a description of a process for making a vertical n-type SiC Schottky diode, as shown in FIGS. 5 and 6, with a field spreading ring, as shown in FIGS. 4A, 4B, 4C, 4D, 4E, 5 & 6, starting with a uniformly doped, n-type SiC, single crystal wafer (thickness≈400 μms) as substrate 12.
NOTE: the W/WC layers must be deposited and annealed before processing of the Os/n-SiC contact structure begins.

1. Deposit (or ion implant nitrogen and activate) approximately 100 Å to 1,000 Å of n+ SiC on one (bottom) side of substrate 12.

Cold wall chemical vapor deposition (CVD) @ 1400° C. in diluent hydrogen.

Reactants: silane and ethylene for SiC growth, and ammonia as the nitrogen source for n-type doping (n≈≧1E18/cc).

No fundamental limit on layer thickness (>0 to ∞).

1A. On the top (opposite.) n-type SiC surface, grow native oxide in wet oxygen at 1100–1250° C. Any other oxide formation procedure can be used.

2. Deposit approximately 700 Å of TiC on the n+ SiC (bottom) surface.

CVD @ 1290° C. in diluent hydrogen; this temperature anneals the TiC as it is formed.

Reactants: titanium tetrachloride (Ti source) and ethylene (carbon source).

TiC thickness should be less than about 1,800 Å, or it will begin to introduce strain into the SiC layer (Ref. 14).

3. Perform photolithography and oxide etching procedures as shown in FIGS. 4A and 4B to mask the opposite (upper) SiC surface such that an array of circular areas are exposed on the SiC upper surface and each exposed SiC circle is surrounded by an annular oxide ring (the remainder of the surface is covered with photoresist). The diameters of the exposed SiC circles in experimental devices were 20, 40, 80 and 200 μms.

3B. For the rectifying n-type contact only, we should have RF sputtered a few monolayers of Si on the structure shown in FIG. 4C.

4. Deposit approximately 1,000 Å of Os (>99% purity) on the masked SiC and oxide field ring surfaces.

RF sputter deposit Os in a vacuum, as shown in FIG. 4D, after 20 sec. in-situ Ar sputter cleaning of the SiC surface. Note: Os can also be deposited by CVD, DC sputtering or electroplating.

No fundamental limit on layer thickness (>0 to ∞).

5. Remove photoresist mask (lift-off) and clean SiC surface containing circular Os diodes, as shown in FIG. 5.

6. Deposit ~400 Å of WC on TiC surface.

Reactive sputtering: DC sputter W and react with hydrocarbon gas to form WC at the TiC surface.

No fundamental limit on WC thickness (>0 to ∞)

7. Deposit ~400 Å of W (>96% purity; >99.9% preferred) on WC surface, as shown in FIG. 2.

DC sputtering in vacuum.

8. Deposit ~150 Å Pt (or W, Pd, Au, Cu, Ni, etc.) cap over Os as shown in FIGS. 4E and 6. The cap serves several purposes: (1) protect Os from oxidation (Pt does not oxidize at any temperature, but Os forms a volatile oxide at about 160° C.), (2) circuit metal, (3) part of a bonding layer (electrode).

DC sputtering in vacuum.

9.1 Anneal structure at ≦1150° C., if Os/OsSi/SiC junction is desired.

9.2 Anneal structure at ~1000° C. to obtain a thin OsSi layer and a fully formed Os/SiC junction. Annealing at 1000° C. bonds Pt cap to Os surfaces to protect Os from oxidation; also bonds W layer to WC layer.

10. Continuation of the structure can be performed by standard techniques.

Description of PN Diode Fabrication Process

Following is a description of the process for fabrication of a vertical p+-n SiC diode as shown in FIG. 3, starting with a uniformly doped, n-type SiC, single crystal wafer (thickness≈400 μms). Photolithography steps to define device shape and field spreading ring can be performed as shown in FIGS. 4A, 4B, 4C, 4D, 4E & 5.

1. Deposit approximately 1,000 Å of p+-SiC on one side.

Cold wall chemical vapor deposition (CVD) @ 1400° C. in diluent hydrogen.

Reactants: silane and ethylene for SiC growth, and dimethylaluminum hydride as the Al source for p-type doping [p≧1E18/cc].

2. Deposit approximately 1,000 Å of n+-SiC on opposite side.

Cold wall chemical vapor deposition (CVD) @ 1400° C. in diluent hydrogen. Reactants: silane and ethylene for SiC growth, and ammonia as the nitrogen source for n-type doping [n≈1E18/cc].

No fundamental limit on layer thickness (>0 to ∞)

3. Deposit approximately 700 Å of TiC on the n+-SiC surface.

CVD @ 1250° C. in diluent hydrogen. Reactants: titanium tetrachloride (Ti source) and ethylene (carbon source).

TiC should be less than about 1,800 Å, or it will begin to introduce strain into the SiC layer (Ref. 14).

4. Deposit approximately 1,000 Å of Os on the p+-SiC surface.

DC sputter deposit Os in a vacuum, after 20 sec. in-situ Ar sputter cleaning of the SiC surface.

No fundamental limit on Os layer thickness (>0 to ∞). Then deposit ~150 Å Pt cap over Os.

CVD or electroplating also can be used.

5. Deposit ~400 Å of WC on TiC surface.

Reactive sputtering: DC sputter W and react with hydrocarbon gas to form WC at the TiC surface.

No fundamental limit on WC thickness (>0 to ∞)

6. Deposit ~400 Å of W on WC surface.

DC sputtering in vacuum.

7. Anneal structure at ≦1150° C.

8. Continuation of the structure can be performed by standard techniques.

Other SiC Devices Using Os and Ti/WC/W Contacts

The basic solid state semiconductor devices used as building blocks for solid state electronic circuits are resistors, diodes, transistors and thyristors. All of these can be made in SiC using the contact structures of the present invention, using the foregoing processes.

RESISTORS

Majority carrier devices requiring at least two spaced p-type or two spaced n-type ohmic contacts. Examples include varistors and resistance thermistors. A typical lateral form of such devices can be that of the MESFETs further described below with reference to FIGS. 8A and 8B but without a gate contact. Vertical varistors and resistance thermistors can be made in the manner shown in FIG. 2 but with ohmic contacts 16 at both ends.

Applications include temperature transducers operable over temperature ranges from 100° C. to at least 1050° C. for Os ohmic contacts on p-type devices and to 1150° C. for TiC/WC/W ohmic contacts on n-type devices.

DIODES

Majority carrier diodes (p-type & n-type) require an ohmic and a rectifying metal contact, as described above with reference to FIGS. 2, 5 and 6. Examples include junction thermistors (thermal sensors) mixers (communications), ultrafast recovery (power conditioning), light emitting displays (LEDs).

Minority carrier diodes ($p^+n$ & $n^+p$ and pin) require both n-type and p-type ohmic contacts, as described above with reference to FIG. 3. The range of applications and types of devices are enormous (see e.g. Sze). Such diodes are used for thermal sensing, power conditioning, power conversion, radiation detection and LED display electronics.

TRANSISTORS

Figure 7:
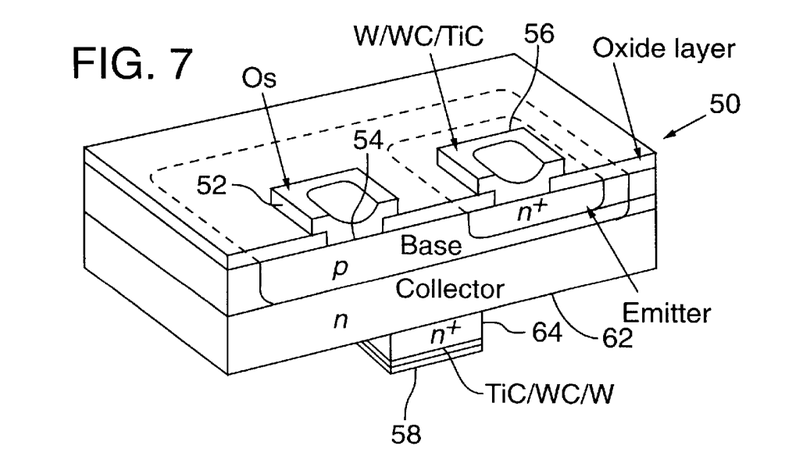
FIG. 7 is a perspective view of a planar NPN bipolar transistor on a SiC substrate with an Os base contact and W/WC/TiC emitter and collector contacts in accordance with the invention.

Bipolar transistors are minority carrier devices with two p-n junctions. They require two n-type and one p-type, or vise-versa, contacts. While the applications range is enormous, bipolar transistors are best known for use in TTL (transistor-transistor-logic). Referring to FIG. 7, an npn bipolar transistor 50 is shown. It includes an Os ohmic contact 52 to the p-type base region 54, preferably capped with Pt as shown in FIG. 6, a TiC/WC/W ohmic contact 56 to the emitter region 60 and a TiC/WC/W ohmic contact 58 to collector region 62 via n+ layer 62.

Figure 8A:
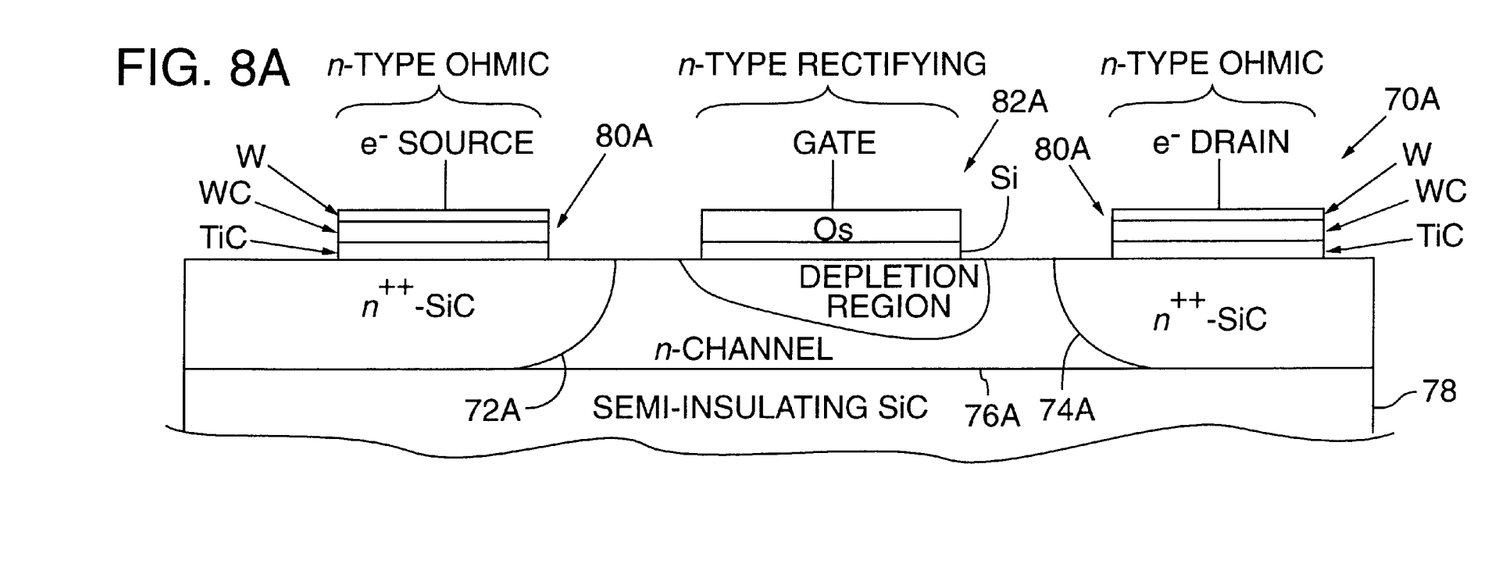
FIGS. 8A and 8B are cross-sectional views of two MESFET structures formed on a semi-insulating SiC substrate with an Os/Si gate contact and W/WC/TiC ohmic source and drain contacts in accordance with the invention.
Figure 8B:
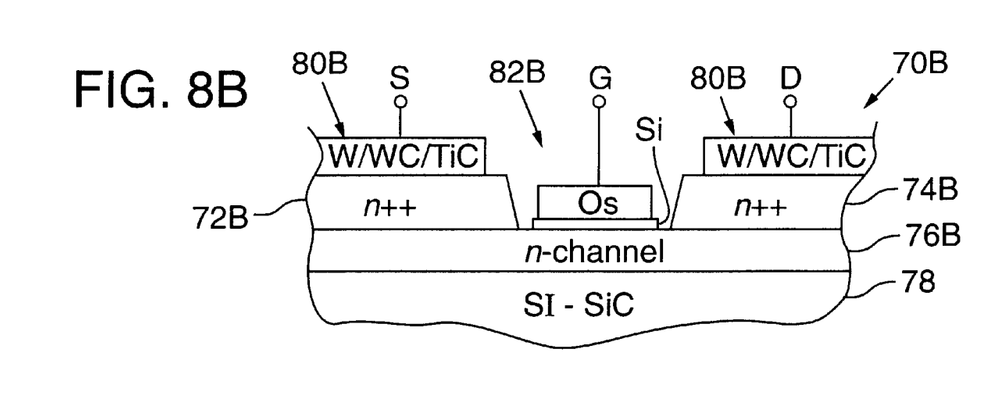

Unipolar transistors, commonly referred to as MESFETs (metal-semiconductor FETs) are majority carrier devices (usually n-type, but can be p-type). Two such devices are shown in FIGS. 8A and 8B. MESFET 70A in FIG. 8A is formed by diffusing n++ source and drain contact regions 72A, 74A into an n-channel layer 76 epitaxially-deposited on a semi-insulating SiC substrate 78. MESFET 70B in FIG. 8B is formed by epitaxially-depositing an n++ source and drain layer on channel layer 76 on a semi-insulating SiC substrate 78, and then dividing the n++ layer into separate source and drain contact regions 72B, 74B by etching a channel down to layer 76B prior to forming gate structure 82B. The source and drain each use an ohmic contact: in the illustrated example, this is the TiC/WC/W ohmic contact 80, made in the form of the contact structure 16 shown in FIGS. 2 and 3, on the n++ regions 72B, 74B. The gate requires a Schottky rectifying contact 82 which is provided by the Os contact 14 of the form shown in FIG. 6. The gate structure is formed in the same manner as the Schottky contact 14 shown in FIGS. 4A–4E. In similar manner, a p-channel MESFET can be formed using p++source and drain regions, a p-type channel, Os source and drain contact structures, and a TiC/WC/W rectifying gate contact over the p-channel. The MESFET Applications include power conversion (DC to high frequency), generally used for high frequency communications and radar.

MOSFET (depletion & inversion). Requires ohmic contacts to source and drain, parasitic p-n junction and back contact. FIGS. 9A and 9B respectively show n-channel and p-channel MOSFET devices, 88A, 88B. In FIG. 9A, the n-channel device 88A has n-type source and drain regions 90A, 92A formed in a p-type SiC substrate 94A. W/WC/TiC ohmic contacts 96 are formed over regions 90A, 92A, in the manner described above. In the p-channel device 88B, n-type source and drain regions 90B, 92B are formed in a p-type SiC substrate 94B. The source and drain regions 90B, 92B have Os ohmic contacts 98, as described above. In both devices 88A and 88B, the MOSFET gate is formed by a thin oxide layer 97 positioned over the channel between the source and drain regions and covered by a conductive Os layer 99. The use of Os as a gate metal on an oxide layer could have significant advantages for creating n-channels in p-type SiC. Osmium has good adherence to $SiO_2$ and is highly conductive.

THYRISTORS (and GTO, IGT, IGBT, etc. devices):

Having three p-n junctions, these devices are typically used for power conditioning. Thyristor structures can requires as many as four ohmic contacts. MOS-gated and IGBT-type devices are essentially thyristors or silicon controlled rectifiers (SCRs) with capacitively coupled control electrodes, i. e. a MOSFET gate, as shown for example, in U.S. Pat. Nos. 3,831,187 to Neilson; 4,199,774 to Plummer; and 4,364,073 to Becke, and further described in Ref. 16. Such devices typically require ohmic contacts to the MOSFET source and drain, and ohmic contacts to the n and p sides of the two non-shorted junctions in order to control the voltage bias and polarity at each junction, as well as a MOS gate.

Figure 10A:
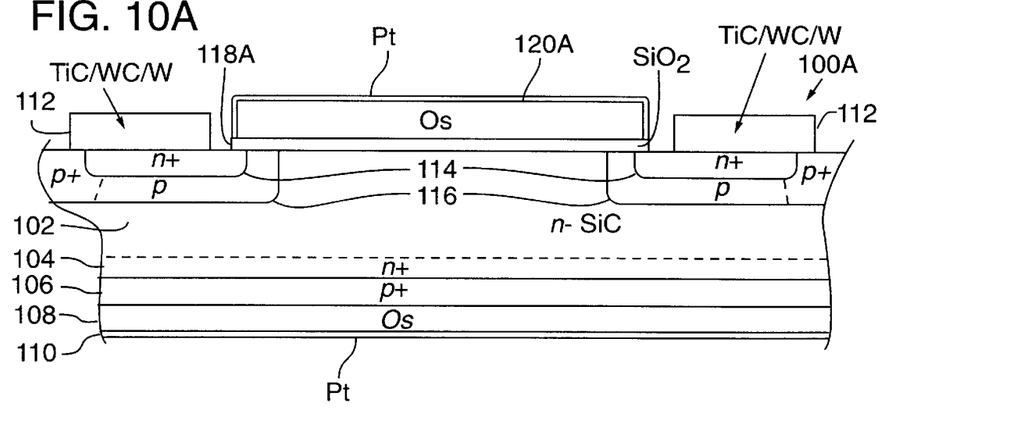
FIGS. 10A and 10B are cross-sectional views of gate controlled thyristor/SCR/IGBT devices with W/WC/TiC, Os and Os-on-oxide contacts in accordance with the invention.
Figure 10B:
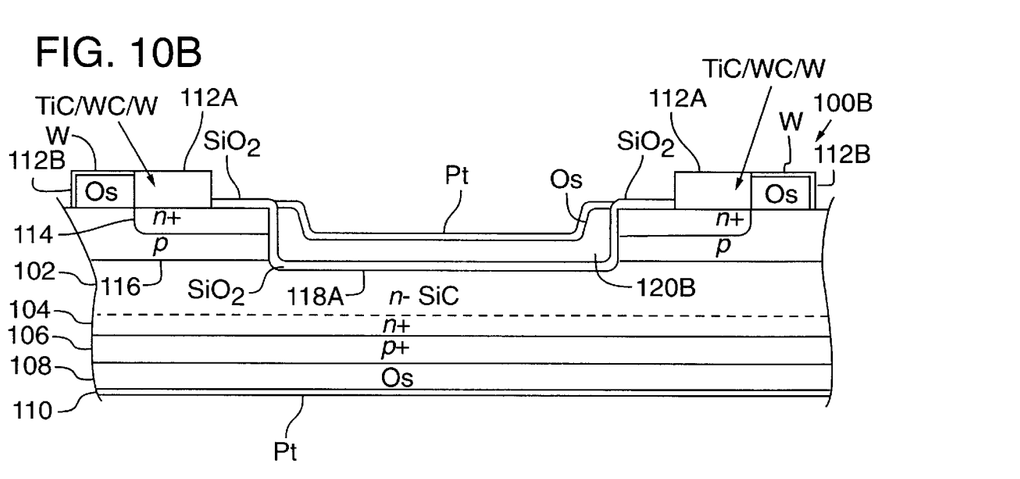

Examples of such devices are shown in FIGS. 10A and 10B. The illustrated vertical devices 100A, 100B are similar in overall arrangement, both being formed on an n-type SiC substrate 102 with an n+ buffer layer 104 and a p+ anode region 106 and an Os ohmic contact layer 108 capped by a Pt protective bonding layer 110. The MOS-gated structures on the opposite side of the device are also similar, having Ti/WC/W ohmic contacts 112 to the n+ source and drain regions 114 and also forming a tunneling junction short or field emission contact to p+ portions of the base or body regions 116 associated with each region 114. Alternatively, the Ti/WC/W ohmic contacts 112 can be connected to the n+source and drain regions 114 alone and an Os ohmic contact portion 112B can be connected to the adjoining P-type base in electrical contact to Ti/WC/W ohmic contacts 112. The MOS gate structure in device 10A is planar, similar to that of FIGS. 9A and 9B, with an oxide layer 118A and a platinum-capped Os electrode layer 120A forming the MOS gate contact. The MOS gate structure in device 10DB is recessed in a trench formed between the source and drain regions, with an oxide layer 118B and a platinum-capped Os electrode layer 120B lining the sidewalls of the tren-ch to form the MOS gate contact along the sidewalls adjacent the p-body.

Having described and illustrated the principles of the invention in a preferred embodiment thereof, it should be apparent that the invention can be modified in arrangement and detail without departing from such principles. While the devices shown herein are vertical and lateral devices formed on planar substrates, with the contacts either on both sides or spaced apart on one side of the substrate, other surface arrangements may be used, for example, a V-shaped notch or U-shaped trench, for placement of the claimed contacts. I claim all modifications and variation coming within the spirit and scope of the following claims.

REFERENCES

1. Parsons, J. D.; Wu, J. G.; Chaddha, A. K. and Chen, H-S., "Base for Device Quality β-SiC, "U.S. Pat. No. 5,492,752, issued Feb. 22, 1996.
2. Daimon, H.; Yamanaka, M.; Sakuma, E.; Misawa, S. and Yoshida, S., "Annealing Effects on Al and Al-Si Contacts to 3C-SiC," Japan Jour. Appl. Phys., Vol. 25, No. 7 (1986) L592.
3. Crofton, J.; Barnes, P. A. and Williams, J. R., "Contact resistance measurements on p-type 6H-SiC," Appl. Phys. Lett., Vol. 62, No. 4 (1993) 384.
4. Chen, J. S.; Kolawa, E., Nicolet, M-A.; Ruiz, R. P., Baud, L.; Jaussaud, C. and Madar, R., "Solid-state reaction of Pt thin film with single crystal (001)βSiC," J. Mater. Res., Vol. 9, No. 3 (1994) 648.
5. Paparicolaou, N. A.; Christou, A. and Gipe, M. L., "Pt and $PtSi_x$ Schottky contacts on n-type β-SiC," J.Appl. Phys., Vol. 65, No. 9 (1988) 3526.

6. Padovani, F. A. and Stratton, R., "Field and Thermionic-Field Emission in Schottky Barriers," Solid St. Elect., Vol. 9 (1966) 695.

7. Parsons, J. D.; Kruaval, G. B. and Chaddha, A. K., "Low specific resistance (<6×10$^{-6}$Ω·cm$^2$) TiC ohmic contacts to n-type β-SiC," A.P.L., Vol. 65, No. 16 (1994) 2075.

8. Parsons, J. D., "Method of Making Ohmic Contact Structure," U.S. Pat. No. 4,738,937 (1988).

9. Chaddha, A. K.; Parsons, J. D. and Kruaval, G. B., "Thermally Stable, Low Specific Resistance (1.30×10$^{-5}$·cm$^2$) TiC Ohmic Contacts to n-type 6Hα-SiC," A.P.L., Vol. 66, No. 6 (1995).

10. GE Corporate Research & Development letter dated Jan. 1, 1996, to Director BDMO, DoD.

11. Burke, Terence, Dr., Pulse Power Group, U.S. Army Res. Labs., Ft. Monmouth, N.J., (908) 532-0271/0475 (oral communication).

12. Glass, R.; Palmour, J. W.; Porter, L. and Baumgarner, J., "Platinum Contacts to p-type 6H-SiC" Research report of Cree Research & N.C. State University presented at ARPA-sponsored "Workshop on High Power Electronics" Washington D. D. (September 1995).

13. Kimoto, T., et. al., IEEE Elect. Dev. Let., V. 14, No. 12 (1993) 548.

14. Zhao, Q. H., Parsons, J. D., et al. "Single Crystal Titanium Carbide, Epitaxially Grown on Zincblend and Wurtzite Structures of Silicon Carbide" Materials Research Bulletin, Vol. 30, No. 6, pp 761–769 (1995).

15. Fazi, Chris, Dr., U.S. Army Res. Labs., Adelphi, Md.: (301) 394–3011 (oral communication).

16. Baliga, B. Jayant, Modern Power Devices, pages 344–405 (1987).

We claim:

1. A SiC semiconductor device comprising:
  a semiconductor substrate comprising silicon carbide having a first surface and a second surface, the substrate including a first doped region adjacent the first surface and a second doped region adjacent the second surface;
  a first conductive layer comprising metallic osmium (Os) contacting the first surface to form a first contact having an electronic interface to the first doped region; and
  a second conductive layer comprising a metal contacting the second surface to form a second electronic contact to the second doped region.

2. A SiC semiconductor device according to claim 1 in which the first and second doped regions are doped n-type, the first contact forms a Schottky junction and the second contact forms an ohmic junction.

3. A SiC semiconductor device according to claim 2 in which the first and second doped regions and intervening portions of the substrate are doped n-type, the first contact forms a Schottky junction and the second contact forms an ohmic junction, so that the device acts as a Schottky diode.

4. A SiC semiconductor device according to claim 1 in which the first and second regions are doped to a first dopant type and an intervening portion of the substrate is doped to an opposite dopant type to form a first pn junction at an interface adjoining the first region and a second pn junction at an interface adjoining the second region.

5. A SiC semiconductor device according to claim 1 in which the first region is doped to a first dopant type and the second region is doped to a second, opposite dopant type, and an intervening portion of the substrate is doped to form a first pn junction at an interface adjoining the first region, a second pn junction at an interface adjoining the second region and a third pn junction within the intervening portion.

6. A SiC semiconductor device according to claim 1 including a layer of a protective metal covering the Os first conductive layer, selected from a group of conductive metals that is protective of the Os layer against oxidation and adapted to bond to an osmium surface.

7. A SiC semiconductor device according to claim 1 including a layer of a protective metal selected from a group consisting of Pt, Pd, W, Au, PtAu, Ti, Zr, Hf, V, Cr. Fe, Ni, Cu, Nb, Mo, Tc, Ru, Rh, Ag, Ta, Re, Ir.

8. A SiC semiconductor device according to claim 1 in which the second conductive layer comprises metallic osmium (Os).

9. A SiC semiconductor device according to claim 8 in which the first and second regions and intervening portions of the substrate are doped p-type so that the first contact and the second contact each form an ohmic junction and the device acts as a resistive device.

10. A SiC semiconductor device according to claim 8 in which the first and second regions and an intervening portion of the substrate are doped p-type so that the first contact and the second contact each form an ohmic junction and a gate structure contacts a third surface portion contacting the intervening portion of the substrate so that the device acts as field effect transistor.

11. A SiC semiconductor device according to claim 8 in which the first and second regions of the substrate are doped p-type so that the first contact and the second contact each form an ohmic. junction, and an intervening portion of the substrate is doped n-type to form a pn junction with at least one of said first and second regions.

12. A SiC semiconductor device according to claim 8 including a contact coupled to an intervening portion of the substrate so that the device acts as a transistor.

13. A SiC semiconductor device according to claim 12 in which the first and second regions are doped p-type and the intervening portion is doped n-type and contact coupled to the intervening portion comprises a material which forms an ohmic contact therewith so that the device is operable as a bipolar transistor.

14. A SiC semiconductor device according to claim 12 in which the first and second regions are doped p-type and the contact coupled to the intervening portion includes a third metallic layer overlying an insulative layer to form an insulated gate over the intervening portion so that the device is operable as a field effect transistor.

15. A SiC semiconductor device according to claim 14 in which the third conductive layer includes an Os layer.

16. A SiC semiconductor device according to claim 14 in which the third conductive layer includes:
  a titanium carbide (TiC) layer covering the insulative layer;
  a tungsten carbide (WC) layer covering the titanium carbide (TiC) layer; and
  a layer consisting essentially of elemental tungsten contacting the tungsten carbide (WC) layer.

17. A SiC semiconductor device according to claim 12 in which the first and second regions are doped p-type and the contact coupled to the intervening portion includes a conductive layer contacting a surface of the intervening portion so that the device is operable as a transistor.

18. A SiC semiconductor device according to claim 17 in which the contact coupled to the intervening portion includes:
  a titanium carbide (TiC) layer contacting the surface of the intervening portion;

a tungsten carbide (WC) layer covering the titanium carbide (TiC) layer; and a layer consisting essentially of elemental tungsten contacting the tungsten carbide (WC) layer;

the intervening layer being doped p-type so that the device is operable as a transistor.

19. A SiC semiconductor device according to claim 17 in which the contact coupled to the intervening portion includes an Os layer contacting the surface of the intervening portion.

20. A SiC semiconductor device according to claim 1 in which the second conductive layer includes:

a titanium carbide (TiC) layer on the second surface;

a tungsten carbide (WC) layer on the titanium carbide (TiC) layer; and a metallic tungsten (W) layer on the tungsten carbide (WC) layer.

21. A SiC semiconductor device comprising:

a semiconductor substrate comprising silicon carbide having a first surface and a second surface, the substrate including a first doped region adjacent the first surface and a second doped region adjacent the second surface;

a first conductive layer comprising metallic osmium (Os) contacting the first surface to form a first contact having an electronic interface to the first doped region; and a second conductive layer comprising a metal contacting the second surface to form a second electronic contact to the second doped region;

the first region doped n-type and the first contact forming a Schottky junction as said electronic interface.

22. A SiC semiconductor device according to claim 21 in which the first conductive layer includes a thin film of Si or OsSi interfacing the metallic osmium to the first surface of the silicon carbide substrate.

23. A SiC semiconductor device comprising:

a semiconductor substrate comprising silicon carbide having a first surface and a second surface, the substrate including a first doped region adjacent the first surface and a second doped region adjacent the second surface;

a first conductive layer comprising metallic osmium (Os) contacting the first surface to form a first contact having an electronic interface to the first region; and a second conductive layer comprising a metal contacting the second surface to form a second electronic contact to the second doped region;

the first region doped p-type and the first contact forming an ohmic junction as said electronic interface.

24. A SiC semiconductor device according to claim 23 in which the second region is doped n-type, to form a pn junction at an interface between said regions.

25. A SiC semiconductor device according to claim 24 in which the second layer includes:

a titanium carbide (TiC) layer contacting the second surface;

a tungsten carbide (WC) layer covering the titanium carbide (TiC) layer; and a layer consisting essentially of elemental tungsten contacting the tungsten carbide (WC) layer.

26. A SiC semiconductor device comprising:

a semiconductor substrate comprising silicon carbide having a first surface and a second surface, the substrate including a first doped region adjacent the first surface and a second doped region adjacent the second surface;

a first conductive layer comprising a first contact metal layer on the first surface to form a first contact having an electronic interface to the first doped region; and a second conductive layer contacting the second surface to form a second electronic contact to the second doped region of the substrate, the second conductive layer including:

a titanium carbide (TiC) layer contacting the second surface;

a tungsten carbide (WC) layer covering the titanium carbide (TiC) layer; and a layer consisting essentially of elemental tungsten contacting the tungsten carbide (WC) layer.

27. A SiC semiconductor device according to claim 26 in which the second region is doped n-type, and the second contact forms an ohmic junction.

28. A SiC semiconductor device according to claim 26 including a layer of a bonding metal contacting the tungsten layer, selected from a group of conductive metals that is adapted to bond to a tungsten surface.

29. A SiC semiconductor device according to claim 26 including a layer of a bonding metal contacting the tungsten layer, the bonding metal being selected from a group consisting of Pt, Pd, W, Au, PtAu, V, Ti, Zr, Hf, Cr, Fe, Ni, Cu, Nb, Mo, Tc, Ru, Rh, Ag, Ta, Re, Ir.

30. A SiC semiconductor device according to claim 26 in which the second region is doped p-type, and the second contact forms a rectifying junction.

31. A SiC semiconductor device according to claim 26 in which the first conductive layer includes:

a titanium carbide (TiC) layer on the first surface;

a tungsten carbide (WC) layer on the titanium carbide (TiC) layer; and a metallic tungsten (W) layer on the tungsten carbide (WC) layer.

32. A SiC semiconductor device according to claim 31 in which the first and second regions and intervening portions of the substrate are doped n-type so that the first contacts and the second contact each form an ohmic junction and the device acts as a resistive device.

33. A SiC semiconductor device according to claim 31 in which the first and second regions are doped n-type and a contact is coupled to an intervening portion of the substrate, the contact including a third conductive layer overlying an insulative layer to form an insulated gate over the intervening portion so that the device is operable as a field effect transistor.

34. A SiC semiconductor device according to claim 33 in which the conductive layer overlying the insulative layer includes:

a titanium carbide (TiC) layer on the insulative surface;

a tungsten carbide (WC) layer on the titanium carbide (TiC) layer; and a metallic tungsten (W) layer on the tungsten carbide (WC) layer.

35. A SiC semiconductor device according to claim 33 in which the conductive layer overlying the insulative layer includes a layer of Os contacting the insulative layer.

36. A SiC semiconductor device according to claim 31 in which the first and second regions are doped n-type and a contact is coupled to an intervening portion of the substrate, the contact including a conductive layer contacting a surface of the intervening portion so that the device is operable as a transistor.

37. A SiC semiconductor device according to claim 36 in which the conductive layer includes:

a titanium carbide (TiC) layer on the surface of the intervening portion;

a tungsten carbide (WC) layer on the titanium carbide (TiC) layer; and a metallic tungsten (W) layer on the tungsten carbide (WC) layer.

38. A SiC semiconductor device according to claim 36 in which the conductive layer includes a layer of Os contacting the surface of the intervening portion.

39. A SiC semiconductor device according to claim 36 in which the intervening portion of the substrate is doped p-type so that the device is operable as a bipolar transistor.

40. A SiC semiconductor device according to claim 36 in which the intervening portion of the substrate is doped n-type so that the device is operable as a MESFET.

41. A SiC semiconductor device according to claim 40 in which the contact contacting a surface of the intervening portion comprises an Os layer.

42. A SiC semiconductor device according to claim 31 including a contact coupled to an intervening portion of the substrate so that the device acts as a transistor.

43. A SiC semiconductor device according to claim 42 in which the gate contact material includes a third conductive layer overlying an insulative layer to form an insulated gate over the intervening portion so that the device acts as a field effect transistor.

44. A SiC semiconductor device according to claim 26 in which the first region is doped p-type and the first conductive layer is formed of a material suitable to form an ohmic contact with the first region, the second region is doped n-type to form an ohmic contact to the second conductive layer, and the substrate includes a first n-type intervening portion adjoining the first region and a second p-type intervening portion adjoining the second region of the substrate so as to define a four-layer device having three pn junctions electrically coupled between said first and second conductive layers.

45. A SiC semiconductor device according to claim 44 in which the first doped conductive layer comprises an Os layer contacting the first region.

46. A SiC semiconductor device according to claim 44 including a third conductive layer contacting a surface of one of the intervening portions.

47. A SiC semiconductor device according to claim 46 in which the third conductive layer comprises one of an Os layer and a TiC/WC/W layer.

48. A SiC semiconductor device according to claim 44 in the third conductive layer is capacitively coupled to a surface of one of the intervening portions.

49. A SiC semiconductor device according to claim 48 in which the third conductive layer comprises one of an Os layer and a TiC/WC/W layer.

50. A SiC semiconductor device comprising:
a semiconductor substrate comprising silicon carbide having a first surface and a second surface, the substrate including a first doped region adjacent the first surface and a second doped region adjacent the second surface;
a first conductive layer comprising metallic osmium (Os) contacting the first surface to form a first contact having an electronic interface to the first doped region; and
a second conductive layer comprising a metal contacting the second surface to form a second electronic contact to the second doped region;
the device being operative to support electrical conduction in at least one direction between the contacts through the first and second doped regions via the electronic interface.

51. A SiC semiconductor device according to claim 50 in which the first doped region includes a portion consisting essentially of p-type SiC so that the electronic interface supports bidirectional electrical conduction between the first contact and the substrate.

52. A SiC semiconductor device according to claim 50 in which the first doped region includes a portion consisting essentially of n-type SiC so that the electronic interface supports unidirectional electrical conduction between the first contact and the substrate.

53. A SiC semiconductor device comprising:
a semiconductor substrate comprising silicon carbide having a first surface and a second surface, the substrate including a first doped region adjacent the first surface and a second doped region adjacent the second surface;
a first conductive layer consisting essentially of metallic osmium (Os) contacting the first surface to form a first contact having an electronic interface to the first doped region; and
a second conductive layer comprising a metal contacting the second surface to form a second electronic contact to the second doped region.

54. A SiC semiconductor device according to claim 50 in which the first and second doped regions consist essentially of p-type SiC and the second contact consists essentially of metallic osmium (Os).

* * * * *

UNITED STATES PATENT AND TRADEMARK OFFICE
CERTIFICATE OF CORRECTION

PATENT NO.   : 5,929,523
DATED        : July 27, 1999
INVENTOR(S)  : Parsons

It is certified that error appears in the above-identified patent and that said Letters Patent is hereby corrected as shown below:

Column 2,
Line 21, "Transition metals SiC surfaces," should read -- Transition metals such as Mo and W do not adhere well to SiC surfaces, --;

Column 14,
Line 9, "V, Cr. Fe," should read -- V, Cr, Fe, --;
Line 29, "ohmic. junction," should read -- ohmic junction, --;

Column 17,
Line 35, "first doped conductive layer ...first region." should read -- first conductive layer...first doped region. --;

Column 18,
Line 40, "claim 50" should read -- claim 53 --.

Signed and Sealed this

Twenty-fifth Day of February, 2003

JAMES E. ROGAN
*Director of the United States Patent and Trademark Office*